United States Patent
Kim et al.

(10) Patent No.: US 11,875,038 B2
(45) Date of Patent: Jan. 16, 2024

(54) BLOCK ALLOCATION FOR MULTI-CE/DIE STRUCTURE SSD

(71) Applicant: Western Digital Technologies, Inc., San Jose, CA (US)

(72) Inventors: Min Young Kim, Suwon (KR); Min Woo Lee, Hwasung (KR); Dhayanithi Rajendiran, Milpitas, CA (US); Hiep Tran, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 115 days.

(21) Appl. No.: 17/235,499

(22) Filed: Apr. 20, 2021

(65) Prior Publication Data

US 2022/0334731 A1 Oct. 20, 2022

(51) Int. Cl.
*G06F 3/06* (2006.01)
(52) U.S. Cl.
CPC .......... *G06F 3/0619* (2013.01); *G06F 3/0631* (2013.01); *G06F 3/0644* (2013.01); *G06F 3/0653* (2013.01); *G06F 3/0679* (2013.01)
(58) Field of Classification Search
CPC .... G06F 3/0619; G06F 3/0631; G06F 3/0644; G06F 3/0653; G06F 3/0679
See application file for complete search history.

(56) References Cited

U.S. PATENT DOCUMENTS

| | | | |
|---|---|---|---|
| 6,954,649 B2 | 10/2005 | Kotzin | |
| 10,037,152 B2 | 7/2018 | Li | |
| 10,446,257 B2 * | 10/2019 | Kim | G11C 11/5671 |
| 10,802,751 B2 | 10/2020 | Koo et al. | |
| 10,901,625 B2 * | 1/2021 | Yano | G06F 3/0685 |
| 2014/0359382 A1 | 12/2014 | Choi | |

FOREIGN PATENT DOCUMENTS

KR 101485577 B1 1/2015

* cited by examiner

*Primary Examiner* — Francisco A Grullon
(74) *Attorney, Agent, or Firm* — PATTERSON + SHERIDAN, LLP; Steven H. VerSteeg

(57) ABSTRACT

The present disclosure generally relates to methods and systems for allocating free blocks as decommissioned blocks to replace bad blocks. In certain embodiments, when there are insufficient free blocks in a free block list to replace a bad or defective block for a CE, an FTL scans blocks stored in an unallocated block repository. If there are unallocated blocks available for the CE, one or more is reallocated as free blocks and used to replace the bad or defective block. When only one or no further unallocated blocks for the CE are available, the FTL places the CE in a read-only mode.

20 Claims, 8 Drawing Sheets

BLOCK ALLOCATION FOR MULTI-CE/DIE STRUCTURE SSD

BACKGROUND OF THE DISCLOSURE

Field of the Disclosure

Embodiments of the present disclosure generally relate to block management in a solid-state data storage device, and more particularly, to a decommission block allocation policy in a solid-state data storage device.

Description of the Related Art

In a 1:N Flash Translation Layer:NAND Group Module (FTL:NG) mapping scheme, balancing block allocation across multi-Chip Enable (CE)/die is limited as block sorting processes are required to keep a struck block allocation policy. This policy conventionally results in a negative performance impact due to continual sorting. As a result, free blocks are chosen based on a program erase (PE) count that can result in free block list composition being of blocks for a specific CE or die. When a free block list is dominated by blocks for a specific CE or die, this results in an imbalanced free block composition of the free block list.

If a CE/die scans an imbalanced free block list in the event a decommission block needs to be replaced, this may result in the CE/die not finding an appropriate free block and going into read-only mode. This effect may be exacerbated by conventional approaches that do not have a process to balance free block lists.

What is needed are systems and methods to address the shortcomings of conventional approaches.

SUMMARY OF THE DISCLOSURE

The present disclosure generally relates to allocating free blocks as decommissioned blocks to replace bad blocks. In certain embodiments, when there are insufficient free blocks in a free block list to replace a bad or defective block for a CE, an FTL scans blocks stored in an unallocated block repository. If there are unallocated blocks available for the CE, one or more is reallocated as free blocks and used to replace the bad or defective block. When only one or no further unallocated blocks for the CE are available, the FTL places the CE in a read-only mode; according to certain embodiments, an SSD containing the CE may be transitioned to read-only mode.

In one embodiment a data storage device is disclosed that includes a memory device, and a controller coupled to the memory device, wherein the controller is configured to execute a method for allocating blocks to replace one or more defective blocks in a solid state data storage device. The method includes requesting with a Flash Translation Layer (FTL) a free block for a first Chip Enable (CE) location or a first NAND group location from a free block list responsive to a request to replace a defective block, scanning with the FTL an unallocated block pool, and determining if an unallocated block is available from the unallocated block pool to replace the defective block.

In another embodiment, a controller for a data storage device is disclosed, including an I/O to one or more memory devices comprising computer-readable instructions, and a processor coupled to the one or more memory devices configured to execute the computer-readable instructions and cause the controller to perform a method for allocating blocks to replace one or more defective blocks in a solid-state data storage device. In certain embodiments, the method includes scan a free block list associated with a Chip Enable (CE) location or a NAND group location in the data storage device responsive to detecting a defective block, determine that there are no free blocks in the free block list, and scan an unallocated block pool for an unallocated block.

In another embodiment, a system for storing data is disclosed that includes one or more memory means, and a controller means configured to perform a method for allocating blocks to replace one or more defective blocks in a solid-state data storage device. In embodiments, the method includes detect a defective block in a Chip Enable (CE) location or a NAND group location, determine that a free block is available in a free block list to replace the defective block, increase a remaining free block count for the free block list, and determine that the remaining free block count of the free block list is greater than 1.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, a reference to "the disclosure" shall not be construed as a generalization of any inventive subject matter disclosed herein and shall not be considered to be an element or limitation of the appended claims except where explicitly recited in a claim(s).

The present disclosure relates to allocating free blocks to determining blocks to be decommissioned. In certain embodiments, when there are insufficient free blocks in a free block list to replace a bad or defective block for a CE/die, an FTL scans blocks stored in an unallocated block repository. If there are unallocated blocks available for the CE/die, one or more is reallocated as free blocks and used to replace the bad or defective block. In embodiments a decommission block is a replaceable user block managed in an FTL, to be utilized as a free block to replace a bad or defective block. When only one or no further unallocated blocks for the CE/die are available, the FTL places the CE/die in a read-only mode.

According to certain embodiments, firmware is capable of arranging a free block for decommission regarding CE/die number in the same block management group. When a NG requests a decommissioned block for a certain CE/die, the FTL scans free block lists at first. Simultaneously, FTL counts the number of remaining free blocks for a given CE/die. The count will be used when the FTL determines when to transition to a read-only mode. If the FTL is not able to find a candidate block from all free block lists under the imbalanced free block composition, the FTL moves to an unallocated block pool and scans the pool to get a candidate block for a given CE/die. The FTL continues to count the number of remaining blocks for given CE/die.

Figure 1:
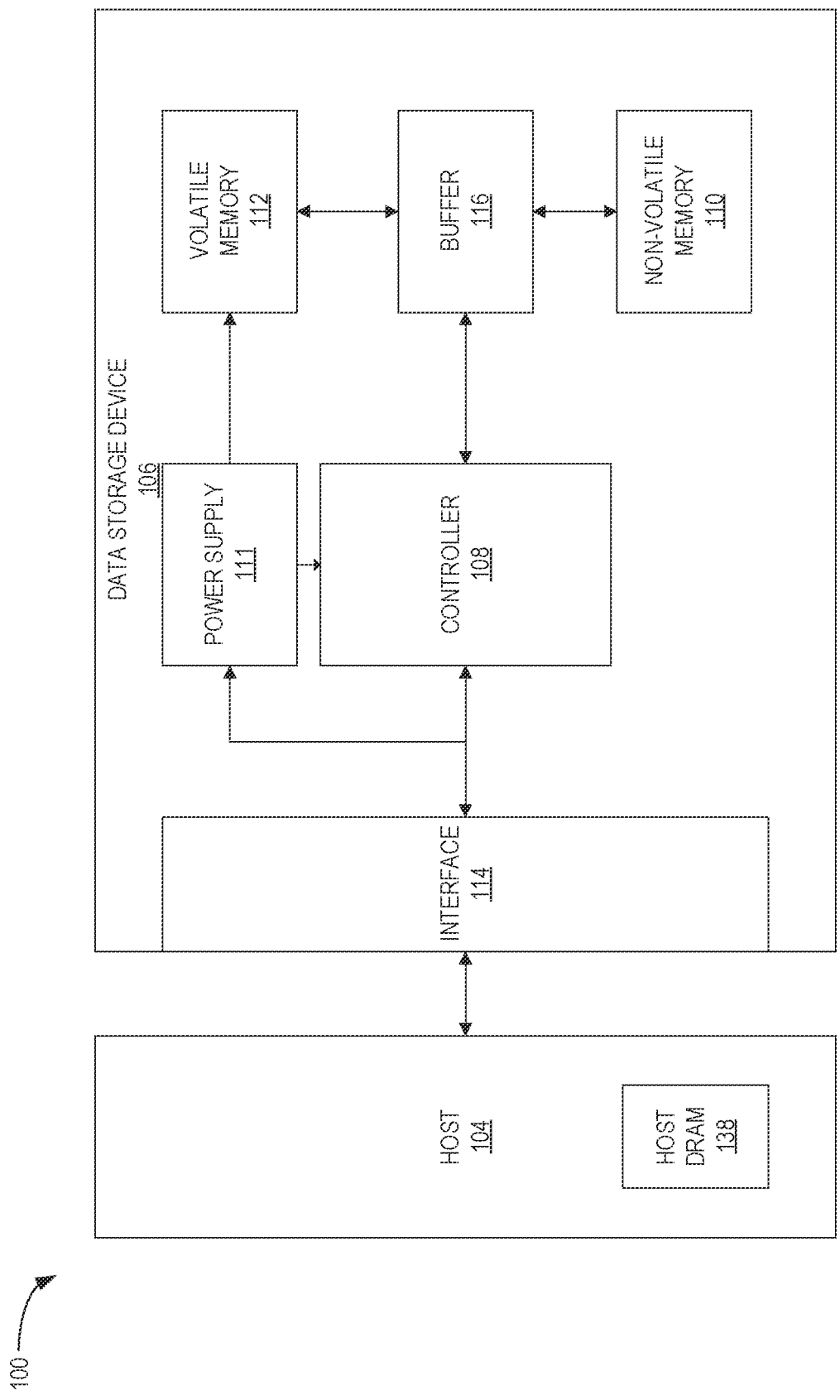
FIG. 1 depicts a schematic block diagram illustrating a storage system in which a data storage device may function as a storage device for a host device, according to certain embodiments.

FIG. 1 depicts a schematic block diagram illustrating a storage system 100 in which data storage device 106 may function as a storage device for a host device 104, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit of NVM 110 may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM)

devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, controller 108 may use volatile memory 112 as a cache. For instance, controller 108 may store cached information in volatile memory 112 until cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store the at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
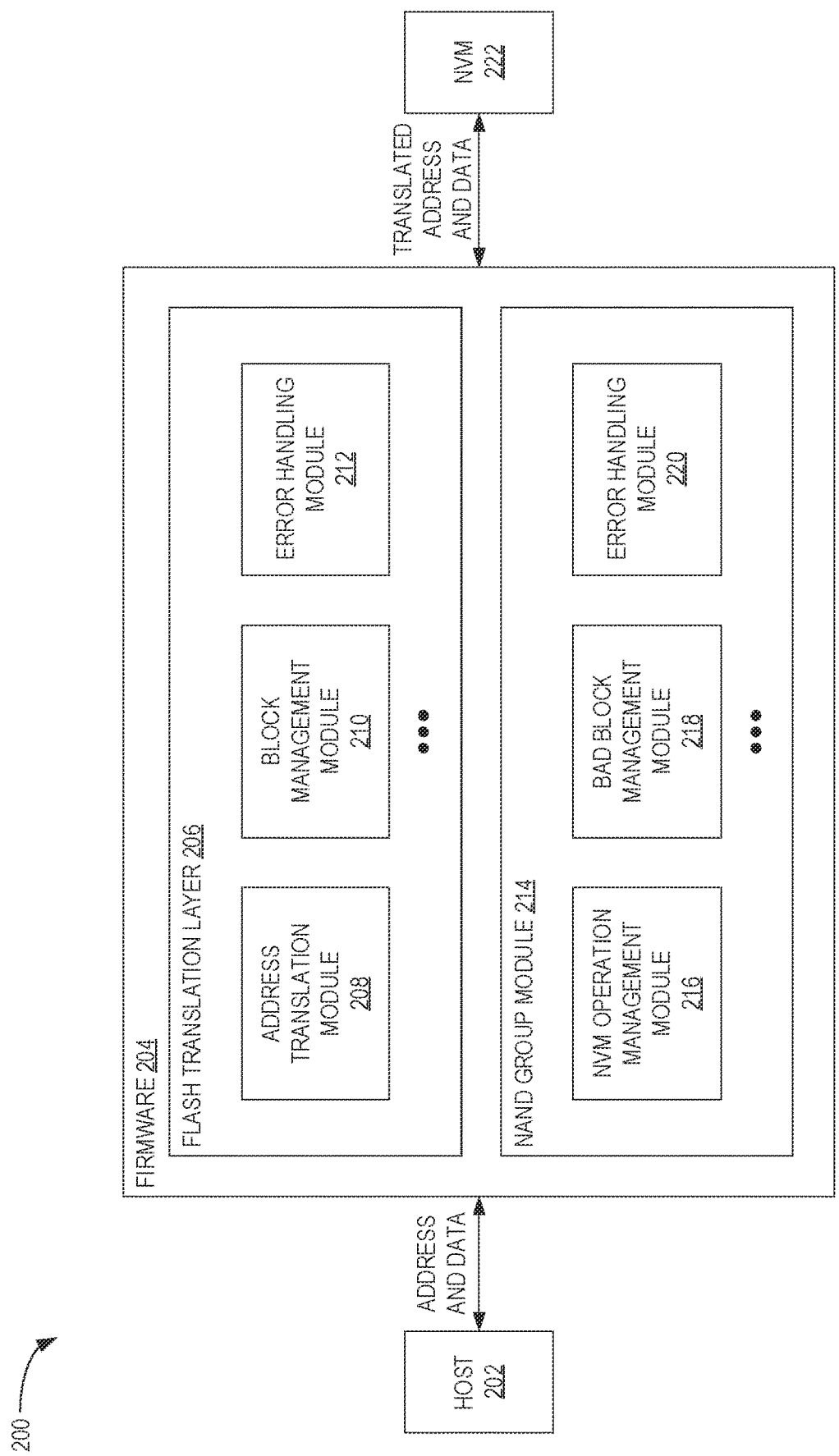
FIG. 2 depicts a schematic block diagram illustrating a storage system including firmware that receives addresses and data from a host device and stores translated addresses and data to an NVM, according to certain embodiments.

FIG. 2 depicts a schematic block diagram illustrating a storage system 200 including firmware 204 that receives addresses and data from a host device 202 and stores translated addresses and data to an NVM 222, according to certain embodiments. The storage system 200 may be part of the storage system 100 of FIG. 1, such that the host device 202 may be the host device 104, the NVM 222 may be the NVM 110, and the firmware 204 may be implemented by one or more processors of the controller 108. The firmware 204 includes a flash translation layer (FTL) 206 and a NAND Group Module (NG) 214. The FTL 206 includes an address translation module 208, a block management module 210, and an error handling module 212. The NG 214 includes an NVM operation management module 216, a bad block management module 218, and an error handling module 220. It is to be understood that firmware 204 may include additional components not shown in FIG. 2 for the sake of clarity.

The FTL 206 and the NG 214 are components of the firmware 204 that may be used to operate a data storage device, such as the data storage device 106 of FIG. 1. The FTL 206 utilizes the address translation module 208 to translate a host address (i.e., an address of data received from the host device 202) to an intermediate format to be utilized by the firmware 204. A request is sent to the NG 214, where the NG 214 utilizes the NVM operation management module 216 to determine the current operations of the NVM 222.

The NG 214 may utilize the error handling module 220 to determine if an error is found in a relevant block, such as a defective block, during the NVM operation, such as the write operation. If an error is found while handling the NVM operation, the NG 214 may request a block for decommission utilizing the bad block management module 218 by issuing a request to the error handling module 212. The FTL 206 may utilize the block management module 210 to choose a proper block for the decommission request and allocates the chosen block to the NG 214. After receiving the allocated block from the FTL 206, the NG 214 continues to handle the found error by replacing the relevant block with the allocated block utilizing the bad block management module 218.

Figure 3:
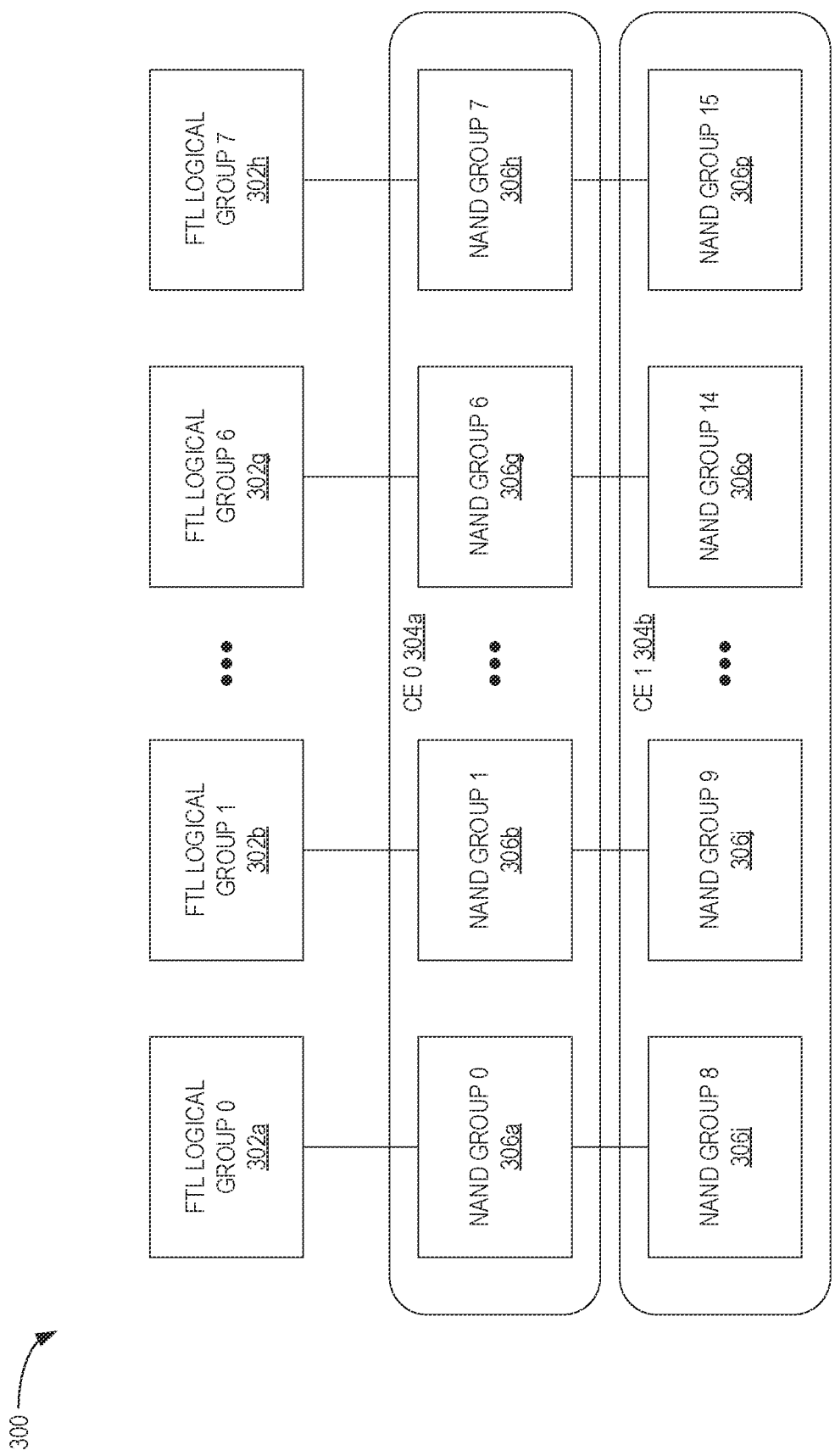
FIG. 3 depicts a schematic block diagram illustrating a 1:N Flash Translation Layer:NAND Group Module (FTL:NG) block management group mapping, according to certain embodiments.

FIG. 3 depicts a schematic block diagram illustrating a 1:N, where N is a NAND group, FTL:NG block management group mapping 300, according to certain embodiments. In the depicted embodiment, the "N" value is 2, such that each FTL logical group 302a, 302b, 302c, 302d is mapped to a NG of each CE 304a, 304b. Each NAND group (NG) may include one or more dies of a NVM, such as the NVM 110 of FIG. 1. For example, a first FTL logical group 0 302a is mapped to a first NG 0 306a of the first CE 0 304a and a ninth NG 8 306i of the second CE 1 304b. Likewise, a second FTL logical group 1 302b is mapped to a second NG 1 306b of the first CE 0 304a and a tenth NG 9 306j of the second CE 1 304b, a seventh FTL logical group 6 302g is mapped to a seventh NG 6 306g of the first CE 0 304a and a fifteenth NG 14 306o of the second CE 1 304b, and an eighth FTL logical group 7 302*h* is mapped to an eighth NG 1 306*h* of the first CE 0 304*a* and a sixteenth NG 15 306*p* of the second CE 1 304*b*. Although a 1:2 FTL:NG mapping is depicted, other mappings are contemplated, and the embodiments described above are not intended to be limiting but to provide an example of a possible embodiment.

Figure 4:
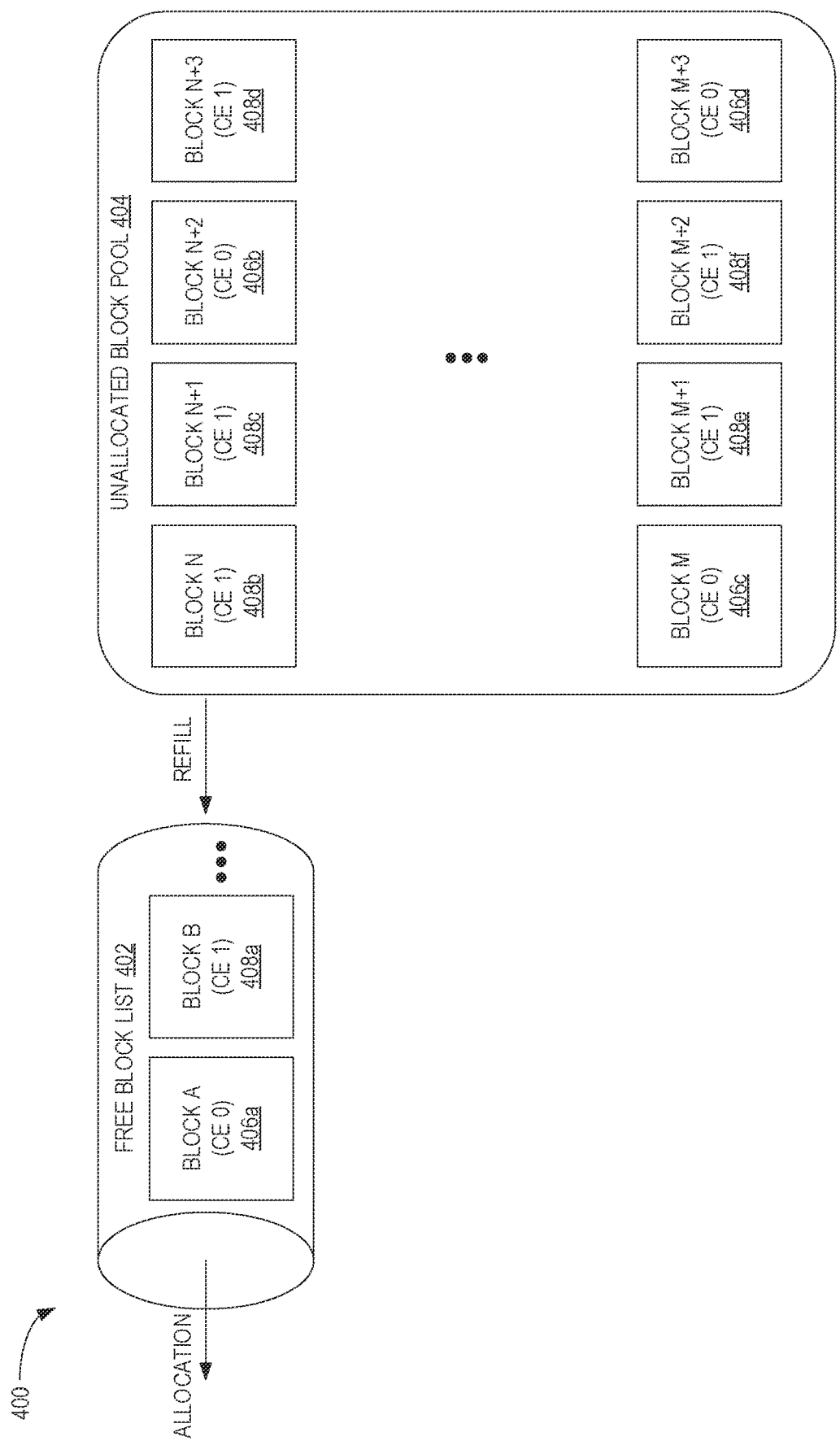
FIG. 4 depicts a schematic block diagram illustrating block allocation for a 1:2 FTL:NG environment, according to certain embodiments.

FIG. 4 depicts a schematic block diagram illustrating block allocation for a 1:2 FTL:NG environment 400, according to certain embodiments. The block allocation for the 1:2 FTL:NG environment 400, herein referred to as environment 400 for simplification, may be the 1:2 FTL:NG block management group mapping 300 of FIG. 3. Environment 400 includes a free block list 402 and an unallocated block pool 404. When a program failure or erase failure occurs during an NVM operation, firmware, such as the firmware 204 of FIG. 2, replaces the defective block with a new block that resides in the same plane, die, and CE in order to maximize parallelism. By maximizing parallelism, read and write performances may be improved. Thus, firmware 204 may attempt to allocate a decommission block located in the same CE as the defective block.

For example, the free block list 402 includes a first block A for a first CE 0 406*a* and a second block B for a second CE 1 408*a*. When firmware 204 detects a defective block for the first CE 0, the firmware 204 determines if there is another block in the free block list 402 for that same CE. In the current example, the free block list 402 includes the first block A for the CE 0 406*a*. The firmware 204 allocates the first block A for the CE 0 406*a* as a decommission block and removes the defective block from the mapping. The unallocated block pool 404 includes a plurality of free blocks or unallocated blocks associated with each CE that may be allocated as decommission blocks, where the blocks 406*b*-406*d*, 408*b*-408*d* of the unallocated block pool 404 refills the free block list 402.

For example, when the first block A for the CE 0 406*a* is allocated as a decommission block, the next block in the unallocated block pool 404, block N for the CE 1 408*b*, is selected to refill the free block list 402. In one example, the blocks of the free block list 402 are refilled from a queue of blocks of the unallocated block pool 404. In another example, the blocks of the free block list 402 are refilled by selecting a similar block, such as from the same CE as the block recently allocated, from the unallocated block pool 404.

Figure 5:
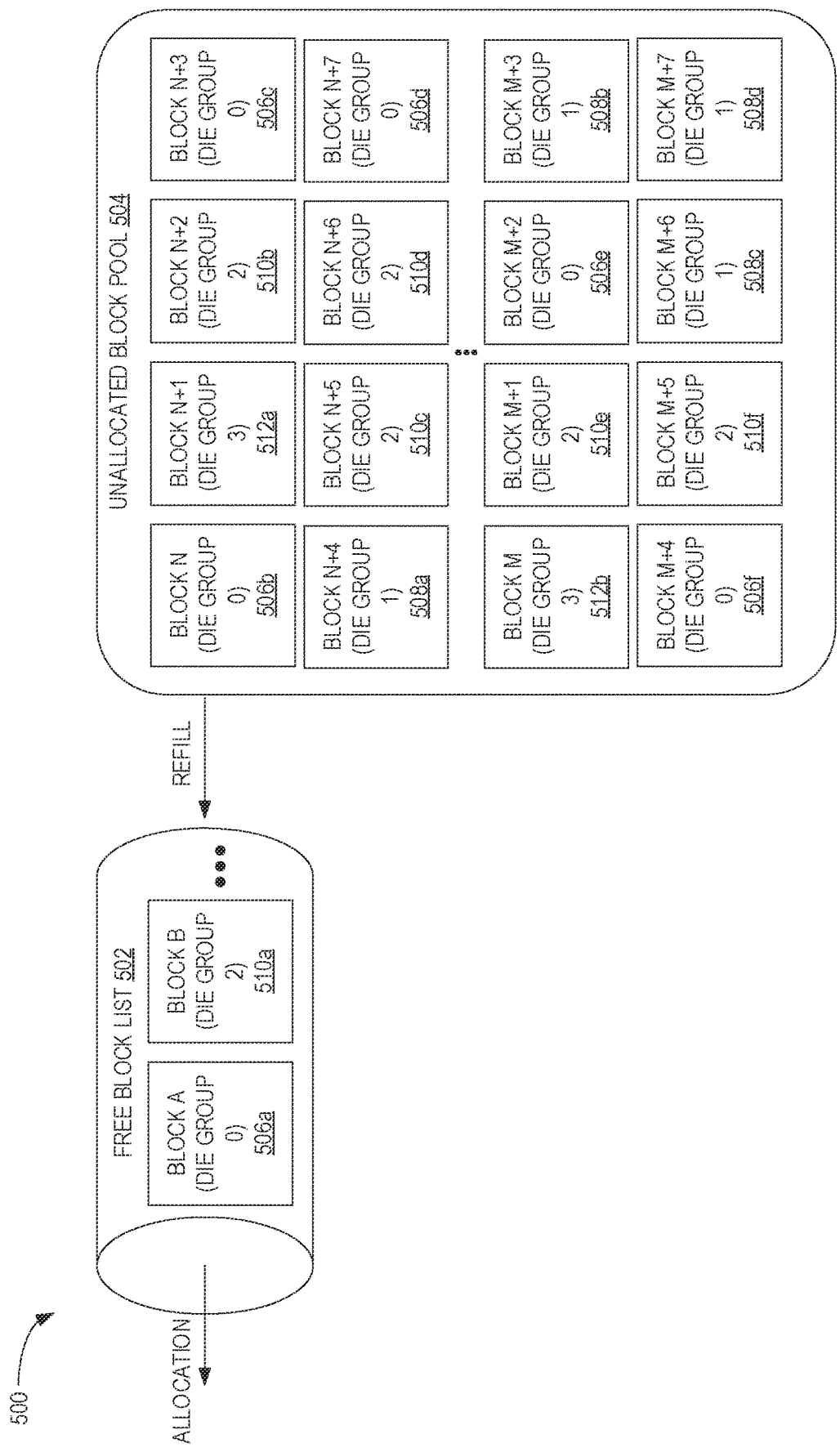
FIG. 5 depicts a schematic block diagram illustrating block allocation for a 1:N FTL:NG environment, according to certain embodiments.

FIG. 5 depicts a schematic block diagram illustrating block allocation for a 1:N FTL:NG environment 500, according to certain embodiments. The block allocation for the 1:N FTL:NG environment 500 may be referred to as environment 500 for simplification herein. Environment 500 may be similar to environment 400, such that when blocks are chosen from a free block list 502 to be allocated as a decommission block, another block is allocated to the free block list 502 from an unallocated block pool 504. In the current example, rather than mapping a plurality of CEs, each die group is mapped that in some embodiments may be a NAND group, or NAND die group. For example, die groups 0-3 each have a mapping to an FTL logical group. The unallocated block pool 504 includes a first die group 0 including a first plurality of blocks 506*b*-506*f*, a second die group 1 including a second plurality of blocks 508*a*-508*d*, a third die group 2 including a third plurality of blocks 510*b*-510*f*, and a fourth die group 3 including a fourth plurality of blocks 512*a*-512*b*. The free block list 502 includes a first block A of the first die group 0 506*a* and a second block b of the third die group 2 510*a*. The number of die groups depicted is not intended to be limiting but to provide an example of a possible embodiment.

Figure 6:
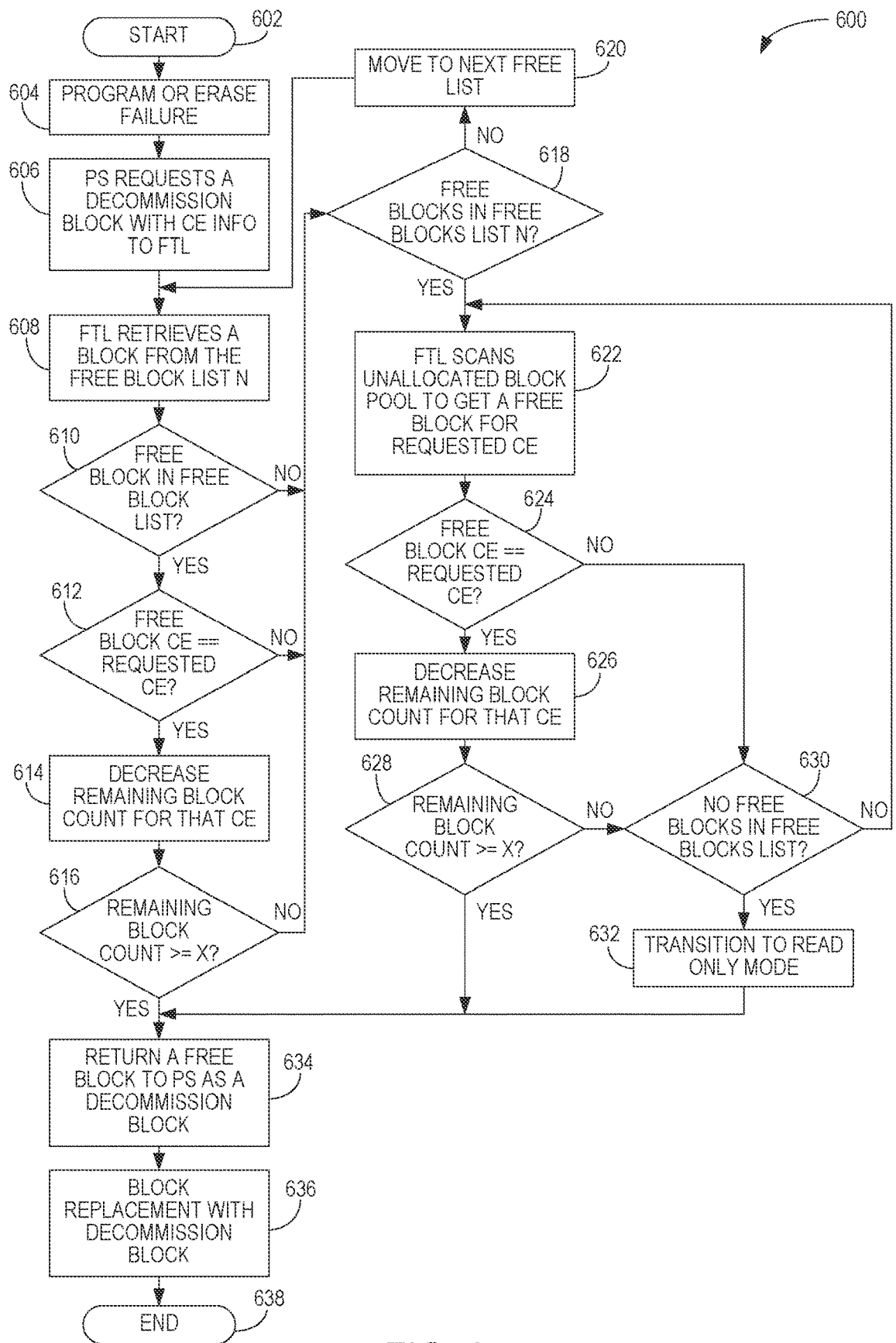
FIG. 6 depicts a flowchart illustrating a method of a decommission block allocation scheme, according to certain embodiments.

FIG. 6 depicts a flowchart illustrating a method 600 of a decommission block allocation scheme, according to certain embodiments. The decommission block allocation scheme may be implemented in the environment 400 of FIG. 4 and environment 500 of FIG. 5 to allocate decommissioned blocks and to avoid an early transition to a read-only mode. In some examples, the method 600 are computer-readable instructions that a controller, such as the controller 108 of FIG. 1, may execute. At block 602, the method 600 begins. At block 604, the controller 108 determines that program or erase failure has occurred to a first block during an NVM, such as the NVM 110 of FIG. 1, operation. The controller 108 may employ firmware, such as the firmware 204 of FIG. 2, to execute the method 600.

At block 606, a NG, such as the NG 214 of FIG. 2, sends a request to an FTL, such as the FTL 206 of FIG. 2, to retrieve a decommission block with CE information from a free block list. At block 608, the FTL 206 retrieves a block from a free block list N, where N represents a free block list of a plurality of free block lists. For example, the free block list N may be the free block list 502 of FIG. 5. At block 610, firmware 204 determines if there is a free block in the free block list 502. In one example, the free block list may be one or more free block lists, where each of the one or more free block lists includes blocks for one or more CEs or one or more die groups. If the free block list 502 has a free block at block 610, firmware 204 determines if the selected free block CE (or die group) is the same as the requested CE at block 612. If the selected free block CE is the same as the request CE at block 612, then at block 614, the remaining block count for that CE is decreased. At block 616, firmware 204 determines if the remaining block count is greater than or equal to "X," where "X" represents a minimum remaining block count. For example, when "X" equals 2, then firmware 204 determines if the remaining block count in the free block list 502 is greater than or equal to 2.

If there are no free blocks in the free block list 502 at block 610, the selected free block CE does not match the requested CE at block 612, or the remaining block count is less than "X" at block 616, then at block 618, the firmware determines if there are any free blocks in a subsequent free block list. If there are no free blocks in the subsequent free block list, then the firmware 204 moves to a next free block list, such as the free block list 402 of FIG. 4, at block 620. The method 600 returns to block 608.

If no, at block 618, then the FTL 206 scans the unallocated block pool 504 to get a free block for the requested CE at block 622. In one example, the scanning may scan the entire unallocated block pool. In another example, the scanning may only scan up to the first occurrence or found block for the requested CE. In yet another example, the scanning may only scan a number of blocks deep, such as 2 blocks deep. At block 624, firmware 204 checks if the selected free block CE is the same as the requested CE.

If yes, at block 624, the remaining block count for that CE is decreased at block 626. At block 628, firmware 204 determines if the remaining block count is greater than or equal to "X." If the CE of the free block is not the same as the requested CE at block 624 or the remaining block count is less than "X," such that the found block for the requested CE is the last free block that can be used as a decommission block, at block 628, then the firmware 204 determines if there are no more free blocks in the unallocated block pool at block 630. If there are no more free blocks in the unallocated block pool at block 630, then at block 632, the firmware 204 transitions the NVM operations for the requested CE or die block to a read-only mode. However, if there are free blocks remaining in the unallocated block pool 504, the method 600 returns to block 622.

At block 634, the selected free block is returned to the NG 214 as a decommission block. At block 636, a bad block management module, such as the bad block management module 218 of FIG. 2, replaces the defective block with the decommission block. At block 638, the method 600 completes.

Figure 7:
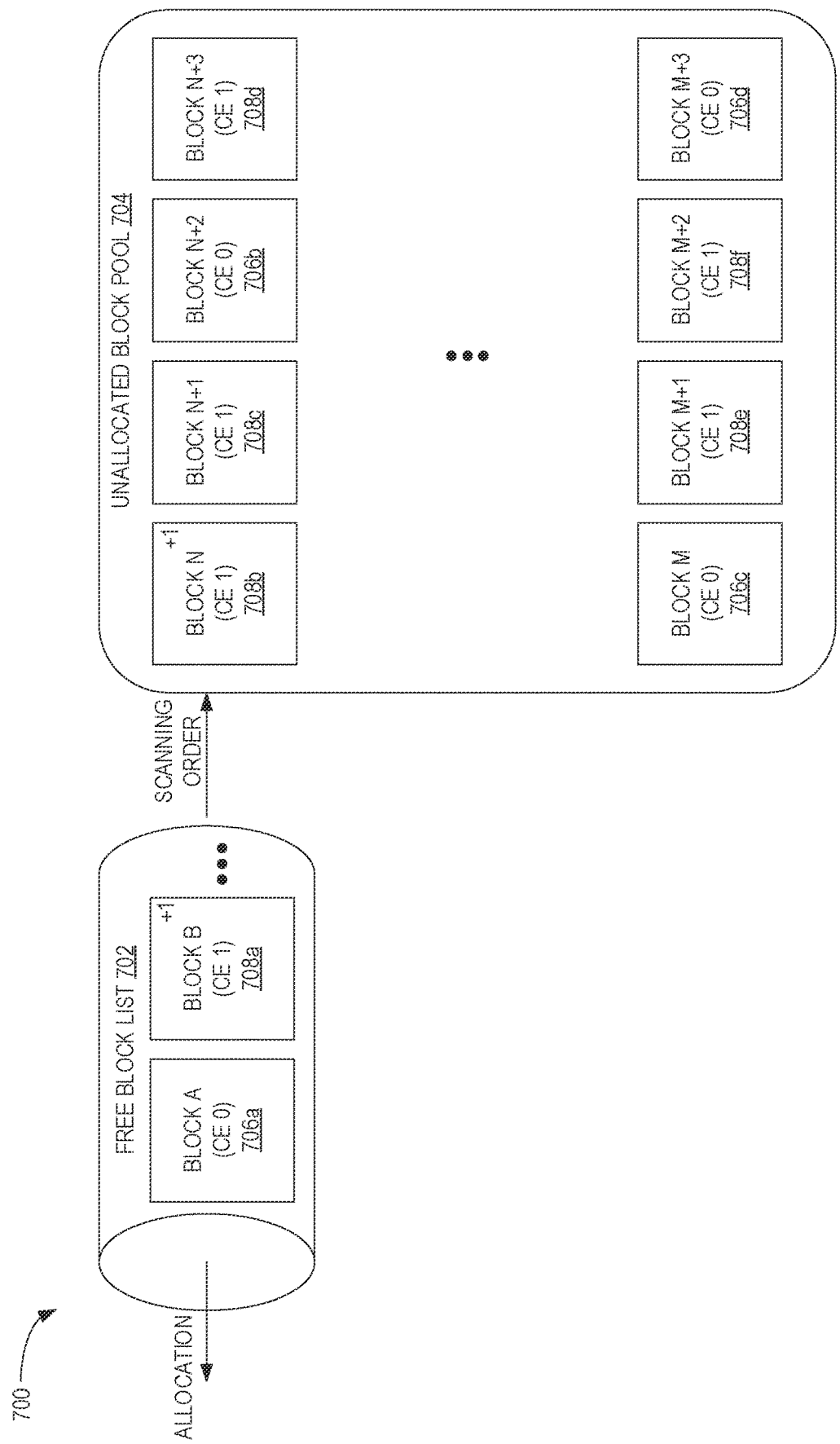
FIG. 7 depicts a schematic block diagram illustrating a free block list and an unallocated block pool for a decommission block allocation scheme, according to certain embodiments.

FIG. 7 depicts a schematic block diagram illustrating a free block list 702 and an unallocated block pool 704 for a decommission block allocation scheme 700, according to certain embodiments. Aspects of the method 600 may be utilized to describe the decommission block allocation scheme 700 for exemplary purposes. When a NG, such as the NG 214 of FIG. 2, requests a decommission block at block 606 from an FTL, such as the FTL 206 of FIG. 2, for a specific CE or die group due to a defective block found during an NVM operation, the FTL 206 scans a free block list 702 for a free block that matches the specific CE or die group at blocks 608, 610, 612. At the same time or near the same time that the FTL 206 scans the free block list 702 for the free block, the FTL 206 counts the remaining number of free blocks for a given CE or die group, such as at blocks 614, 616. The count may be utilized by the FTL 206 to determine when to transition to a read-only mode, such as at block 632.

If the FTL 206 is not able to find a candidate block from all the free block lists (i.e., the one or more free block lists) at block 618, the FTL 206 transitions to scanning an unallocated block pool 704, such as at block 622, to find the candidate block for the request CE or die group. The FTL 206 may also count the number of remaining blocks in the unallocated block pool 704 for the given CE or die group. The unallocated block pool 704 includes any unallocated blocks for one or more CEs or die groups, such Block N (CE 1) 708b, Block N+1 (CE 1) 708c, Block N+2 (CE 0) 706b, Block N+3 (CE 1) 708d, Block M (CE 0) 706c, Block M+1 (CE 1) 708e, Block M+2 (CE 1) 708f, and Block M+3 (CE 0) 706d. The listed CEs/die groups and number of unallocated blocks are not intended to be limiting. Furthermore, in certain embodiments, the unallocated block pool 704 may be empty when there are no unallocated blocks available.

Referring to FIG. 7, when the NG requests a decommission block for CE 1, the FTL 206 determines that block B (CE 1) 708a is located in the free block list 702. After determining that block B (CE 1) 708a is located in the free block list 702, the FTL 206 scans the unallocated block pool 704 to count how many blocks are remaining for the requested CE, CE 1. When the FTL 206 finds the second free block for the requested CE, Block N (CE 1) 708b, the FTL 206 determines if the count is greater than or equal to a value such as "X" as described in the method 600. For example, if the value of "X" is 2, then the FTL 206 may stop scanning after locating the Block N (CE 1) 708b in the unallocated block pool because the FTL 206 has enough free blocks, indicated by "+1", to handle a next decommission request. The FTL 206 returns block B (CE 1) 708a to the NG 214. By scanning the unallocated block pool 704 for additional free blocks for the given CE or die group, an early read-only transition may be avoided.

Figure 8:
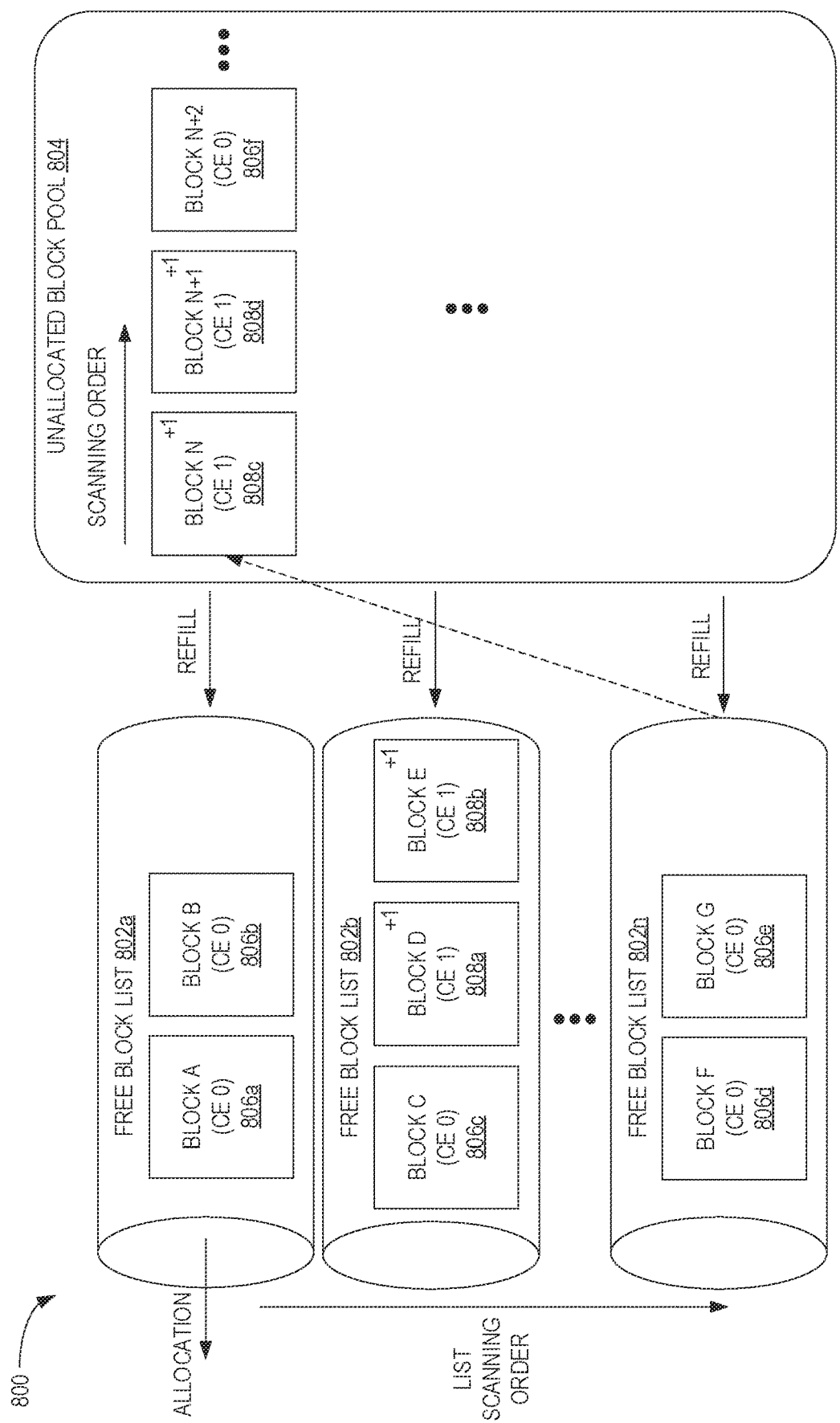
FIG. 8 depicts a schematic block diagram illustrating a plurality of free block lists and an unallocated block pool for a decommission block allocation scheme, according to certain embodiments.

FIG. 8 depicts a schematic block diagram illustrating a plurality of free block lists 802a-n and an unallocated block pool 804 for a decommission block allocation scheme 800, according to certain embodiments. The decommission block allocation scheme 800 may be similar to the decommission block allocation scheme 700 of FIG. 7.

When a NG, such as the NG 214 of FIG. 2, requests a decommission block from an FTL, such as the FTL 206 of FIG. 2, the FTL 206 scans a first free block list 802a for the requested free block for a given CE or die group. For example, the NG 214 may request a decommission block for CE 1. Upon scanning the first free block list 802a, the FTL 206 determines that there are no free blocks that are associated with CE 1, rather the free block list 802 includes Block A (CE 0) 806a and Block B (CE 0) 806b. Because the NG 214 requests a decommission block for the CE 1, Block A (CE 0) 806a and Block B (CE 0) 806b are not sent back to the NG 214 by the FTL 206. Rather than entering a read-only mode prematurely, the FTL 206 then scans a second free block list 802b and an nth free block list 802n. When the FTL 206 scans the second free block list 802b, the FTL 206 determines that the second free block list 802b includes Block C (CE 0) 806c, Block D (CE 1) 808a, and Block E (CE 1) 808b. Thus, the second free block list 802b includes two free blocks associated with CE1.

Upon scanning the nth free block list 802n, the FTL 206 determines that the nth free block list 802 includes free blocks associated with CE 0, Block F (CE 0) 806d and Block G (CE 0) 806e. If a number of blocks associated with a specific requested CE is not met, such as when the count is not greater than or equal to a value such as "X" as described in the method 600, the FTL 206 scans an unallocated block pool 804 for any blocks that match the requested CE. As shown in the unallocated block pool 804, the FTL 206 also locates a first block N (CE 1) 808d and a second block N+1 (CE 1) 808c for the requested CE and a third block N+2 (CE 0) 806d for the non-requested CE, CE 0. The Block D (CE 1) 808a may be provided to the NG 214 to swap with the defective block. However, if the plurality of free block lists 802a-n did not have a free block associated with the requested CE, the first block N (CE 1) 808c may be provided as a decommission block to swap with the defective block. Thus, the early transition to a read-only mode may be avoided.

Furthermore, the FTL 206 may count the number of blocks in the plurality of free block lists 802a-n and the unallocated block pool 804 to determine when a transition to the read-only mode should occur. For example, when the found block is the last free block that can be used as a decommission block for a given CE or die group, the FTL 206 may transition the give CE or die group to the read-only mode. However, when the block is not the last free block in the unallocated block pool 804 for the given CE or die group, the FTL 206 determines not to transition to the read-only mode even though the plurality of free block lists 802a-n may not have a free block for the given CE or die group.

By accurately determining a number of free blocks for a given CE or die group within both a free block list and an unallocated block, early transitions to a read-only mode may be avoided and a memory yield of the data storage device may be improved.

In one embodiment, a method for allocating blocks to replace one or more defective blocks in a solid-state data storage device is disclosed; the method including requesting with a Flash Translation Layer (FTL) a free block for a first Chip Enable (CE) location or a first NAND group location from a free block list responsive to a request to replace a defective block, scanning with the FTL an unallocated block pool, and determining if an unallocated block is available from the unallocated block pool to replace the defective block.

Responsive to determining that an unallocated block is available from the unallocated block pool to replace the defective block, the method further includes allocating an unallocated block from the unallocated block pool as a free block to replace the defective block. The method further includes determining that the unallocated block is from a CE location or a NAND group location that is the same as the first CE location of the defective block. The method further includes increasing a remaining block count for the first CE location or the first NAND location. The method further includes returning the free block to replace the defective block at the first CE location or the first NAND location. Responsive to determining that an unallocated block is not available from the unallocated block pool to replace the defective block, the method further includes scanning a second unallocated block pool of the first CE location or the first NAND location for a second unallocated block. The method further includes transitioning the first CE location or the first NAND location to a read-only mode.

In another embodiment, a controller for a data storage device is disclosed, including an I/O to one or more memory devices comprising computer-readable instructions, and a processor coupled to the one or more memory devices configured to execute the computer-readable instructions and cause the controller to perform a method for allocating blocks to replace one or more defective blocks in a solid-state data storage device. In certain embodiments, the method includes scanning a free block list associated with a Chip Enable (CE) location or a NAND location in the data storage device responsive to detecting a defective block, determine that there are no free blocks in the free block list, and scan an unallocated block pool for an unallocated block.

The computer-readable instructions further cause the processor to determine that an unallocated block is available for the CE location or the NAND location and allocate the unallocated block as a free block. The computer-readable instructions further cause the processor to replace the defective block with the free block. The computer-readable instructions further cause the processor to increase a block count for the CE location or the NAND location. The computer-readable instructions further cause the processor to determine if the block count for the CE location or the NAND location is greater than 1. The computer-readable instructions further cause the processor to determine that the unallocated block is not available. The computer-readable instructions further cause the processor to transition the CE location or the NAND location to a read-only mode.

In another embodiment, a system for storing data is disclosed that includes one or more memory means, and a controller means configured to perform a method for allocating blocks to replace one or more defective blocks in a solid-state data storage device. In embodiments, the method includes detect a defective block in a Chip Enable (CE) location or a NAND location, determine that a free block is available in a free block list to replace the defective block, increase a remaining free block count for the free block list, and determine that the remaining free block count of the free block list is greater than 1.

The method further includes identifying an unallocated block in the CE location or the NAND location from an unallocated block pool. The method further includes increasing the remaining free block count. The method further includes providing the identified unallocated block to replace the defective block. The method further includes determining that there is no unallocated block in an unallocated block pool. The method further includes placing the CE location or the NAND location in a read-only mode.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, wherein the controller comprises a configuration to execute a method for allocating blocks to replace one or more defective blocks in a solid state data storage device, the method comprising:
requesting, with a Flash Translation Layer (FTL), a free block for a first Chip Enable (CE) location from a first free block list responsive to a request to replace a defective block, wherein the first CE location comprises a plurality of NAND group locations;
scanning, with the FTL, the first free block list;
determining that the free block is not available from the first free block list to replace the defective block, wherein:
the first free block list is refilled from a queue of free blocks from an unallocated block pool storing a plurality of free blocks from a plurality of dies of the memory device, wherein the first free block list is a subset of the unallocated block pool and distinct from the unallocated block pool; and
refilling the first free block list comprises selecting a free block from the unallocated block pool that has a same CE location as a free block allocated from the free block list to refill the free block list;
determining that the free block is available from the unallocated block pool to replace the defective block;
replacing the defective block with the free block allocated from the unallocated block pool when the free block is available from the unallocated block pool, wherein the defective block remains in a read-write mode;
allocating the free block responsive to receiving a write command for the first CE location; and
programming data to the allocated free block, wherein the data is associated with the write command.

2. The data storage device of claim 1, wherein the method, responsive to determining that the free block is available from the first free block list to replace the defective block, further comprises allocating the free block from the first free block list to replace the defective block.

3. The data storage device of claim 2, wherein the method further comprises determining that the free block is from a CE location that is the same as the first CE location of the defective block.

4. The data storage device of claim 2, the method further comprising decreasing a remaining block count for the first CE location.

5. The data storage device of claim 4, the method further comprising replacing the defective block at the first CE location with the free block.

6. The data storage device of claim 1, wherein the method, responsive to determining that the free block is not available from the unallocated block pool to replace the defective block, further comprises scanning a second unallocated block pool of the first CE location for a second free block.

7. The data storage device of claim 6, the method further comprising transitioning the first CE location to a read only mode.

8. A controller for a data storage device, comprising:
an input/output (I/O) to one or more memory devices comprising computer-readable instructions;
a processor coupled to the one or more memory devices configured to execute the computer-readable instructions and cause the controller to perform a method for allocating blocks to replace one or more defective blocks in a data storage device, the method comprising:
scanning a first free block list associated with a Chip Enable (CE) location in the data storage device responsive to detecting a defective block, wherein the CE location comprises a plurality of NAND group locations;
determining that there are no free blocks in the first free block list to replace the defective block, wherein:
the first free block list is refilled from a queue of free blocks from an unallocated block pool, wherein the first free block list is a subset of the unallocated block pool and distinct from the unallocated block pool; and
refilling the first free block list comprises selecting a free block from the unallocated block pool that has a same CE location as a free block allocated from the first free block list to refill the free block list;
scanning an unallocated block pool for a free block;
replacing the defective block with the free block allocated from the unallocated block pool when the free block is available from the unallocated block pool, wherein the defective block remains in a read-write mode;
allocating the free block responsive to receiving a write command for the CE location; and
programming data to the allocated free block, wherein the data is associated with the write command.

9. The controller of claim 8, wherein the computer-readable instructions further cause the processor to:
determine that the free block is available for the CE location; and
allocate the free block for the CE location.

10. The controller of claim 9, wherein the computer-readable instructions further cause the processor to replace the defective block with the free block.

11. The controller of claim 10, wherein the computer-readable instructions further cause the processor to increase a block count for the CE location.

12. The controller of claim 11, wherein the computer-readable instructions further cause the processor to determine if the block count for the CE location is greater than or equal to a minimum remaining block count.

13. The controller of claim 8, wherein the computer-readable instructions further cause the processor to determine that the free block is not available.

14. The controller of claim 13, wherein the computer-readable instructions further cause the processor to transition the CE location to a read only mode.

15. A system for storing data, comprising:
one or more memory means; and
a controller means configured to perform a method for allocating blocks to replace one or more defective blocks in a solid state data storage device, the method comprising:
detecting a defective block in a Chip Enable (CE) location, wherein the CE location comprises a plurality of NAND group locations;
determining that a free block is available in a first free block list to replace the defective block, wherein:
the first free block list is refilled from a queue of free blocks from an unallocated block pool, wherein the first free block list is a subset of the unallocated block pool and distinct from the unallocated block pool;
refilling the first free block list comprises selecting a free block from the unallocated block pool that has a same CE location as a free block allocated from the first free block list to refill the free block list;
decreasing a remaining free block count associated with the first free block list;
determining that the remaining free block count of the first free block list is greater than or equal to a minimum remaining block count;
replacing the defective block with the free block from the first free block list when the free block is available from the free block list and the remaining free block count of the first free block list is greater than or equal to the minimum remaining block count, wherein the defective block remains in a read-write mode;
allocating the free block responsive to receiving a write command for the CE location; and
programming data to the allocated free block, wherein the data is associated with the write command.

16. The system of claim 15, the method further comprising identifying the free_block in the CE location from an unallocated block pool.

17. The system of claim 16, the method further comprising decreasing a remaining free block count associated with the unallocated block pool.

18. The system of claim 17, the method further comprising providing the identified free block to replace the defective block.

19. The system of claim 15, the method further comprising determining that there are no free blocks in an unallocated block pool.

20. The system of claim 19, the method further comprising placing the CE location in a read-only mode.

* * * * *